(12) United States Patent
Do

(10) Patent No.: US 11,282,957 B2
(45) Date of Patent: Mar. 22, 2022

(54) VERTICAL FIELD-EFFECT TRANSISTOR (VFET) DEVICES INCLUDING LATCHES HAVING CROSS-COUPLE STRUCTURE

(71) Applicant: Samsung Electronics Co., Ltd., Suwon-si (KR)

(72) Inventor: Jung Ho Do, Hwaseong-si (KR)

(73) Assignee: Samsung Electronics Co., Ltd.

( * ) Notice: Subject to any disclaimer, the term of this patent is extended or adjusted under 35 U.S.C. 154(b) by 473 days.

(21) Appl. No.: 16/406,305

(22) Filed: May 8, 2019

(65) Prior Publication Data

US 2020/0035829 A1 Jan. 30, 2020

Related U.S. Application Data

(60) Provisional application No. 62/702,415, filed on Jul. 24, 2018.

(51) Int. Cl.
*H01L 29/78* (2006.01)
*H03K 3/3562* (2006.01)
(Continued)

(52) U.S. Cl.
CPC ........ *H01L 29/7827* (2013.01); *H01L 27/088* (2013.01); *H01L 29/42356* (2013.01); *H03K 3/3562* (2013.01); *H03K 3/35625* (2013.01); *H03K 19/0948* (2013.01); *H03K 19/0963* (2013.01); *G11C 7/18* (2013.01); *G11C 11/40* (2013.01); *G11C 11/419* (2013.01); *H03K 19/01728* (2013.01); *H03K 19/01855* (2013.01); *H03K 19/096* (2013.01); *H03K 19/177* (2013.01); *H03K 19/17704* (2013.01); *H03K 19/17724* (2013.01); *H03K 19/17736* (2013.01);

(Continued)

(58) Field of Classification Search
CPC ........... H01L 29/7827; H01L 29/42356; H01L 27/088; H03K 3/3562; H03K 3/35625; H03K 19/0948; H03K 19/0963
USPC ........................................................ 327/202
See application file for complete search history.

(56) References Cited

U.S. PATENT DOCUMENTS 9,224,617 B2 12/2015 Pritchard et al.
9,379,027 B2 6/2016 Kim
(Continued)

FOREIGN PATENT DOCUMENTS

WO 2015037086 A1 3/2015
WO 2019171937 A1 9/2019

*Primary Examiner* — Tomi Skibinski
(74) *Attorney, Agent, or Firm* — Myers Bigel, P.A.

(57) ABSTRACT

Integrated circuit devices are provided. The devices may include a substrate including a first region, a second region and a boundary region between the first and second regions. The first and second regions may be spaced apart from each other in a first horizontal direction. The devices may also include a first latch on the first region, a second latch on the second region, and a conductive layer extending in the first horizontal direction and crossing over the boundary region. The first latch may include a first vertical field effect transistor (VFET), a second VFET, a third VFET, and a fourth VFET. The second latch may include a fifth VFET, a sixth VFET, a seventh VFET, and an eighth VFET. The first and seventh VFETs may be arranged along the first horizontal direction. Portions of the conductive layer may include gate electrodes of the first and seventh VFETs, respectively.

20 Claims, 18 Drawing Sheets

(51) Int. Cl.
  *H01L 29/423* (2006.01)
  *H01L 27/088* (2006.01)
  *H03K 19/0948* (2006.01)
  *H03K 19/096* (2006.01)
  *H03K 19/17724* (2020.01)
  *G11C 11/419* (2006.01)
  *H03K 19/177* (2020.01)
  *H03K 19/17748* (2020.01)
  *G11C 7/18* (2006.01)
  *G11C 11/40* (2006.01)
  *H03K 19/17736* (2020.01)
  *H03K 19/20* (2006.01)
  *H03K 19/17704* (2020.01)
  *H03K 19/0185* (2006.01)
  *H03K 19/017* (2006.01)

(52) U.S. Cl.
  CPC ....... *H03K 19/17748* (2013.01); *H03K 19/20* (2013.01)

(56) References Cited

U.S. PATENT DOCUMENTS

| | | |
|---|---|---|
| 9,589,899 B2 | 3/2017 | Jun et al. |
| 9,653,563 B2 | 5/2017 | Liaw |
| 9,704,862 B2 | 7/2017 | Park et al. |
| 9,859,898 B1 * | 1/2018 | Anderson ........ H03K 19/17704 |
| 9,954,529 B2 | 4/2018 | Anderson et al. |
| 10,050,032 B2 | 8/2018 | Baek et al. |
| RE47,095 E | 10/2018 | Tanaka |
| 2018/0108646 A1 | 4/2018 | Lee et al. |
| 2018/0145073 A1 | 5/2018 | Bentley et al. |
| 2018/0175024 A1 * | 6/2018 | Do ..................... H01L 27/0207 |

* cited by examiner

VERTICAL FIELD-EFFECT TRANSISTOR (VFET) DEVICES INCLUDING LATCHES HAVING CROSS-COUPLE STRUCTURE

CROSS-REFERENCE TO RELATED APPLICATION

This application claims priority to U.S. Provisional Application Ser. No. 62/702,415, entitled VTFET CROSS COUPLE STRUCTURE, filed in the USPTO on Jul. 24, 2018, the disclosure of which is hereby incorporated by reference herein in its entirety.

FIELD

The present disclosure generally relates to the field of electronics and, more particularly, to vertical field-effect transistor (VFET) devices.

BACKGROUND

Vertical field-effect transistor (VFET) devices have been researched because of high scalability of VFETs. Further, interconnections between VFETs may be simpler than those between planar transistors.

SUMMARY

According to some embodiments of the present inventive concept, integrated circuit devices may include a substrate including a first region, a second region and a boundary region between the first region and the second region. The first region and the second region may be spaced apart from each other in a first horizontal direction that is parallel to an upper surface of the substrate. The integrated circuit devices may also include a first latch on the first region of the substrate, a second latch on the second region of the substrate, and a conductive layer extending in the first horizontal direction and crossing over the boundary region. The first latch may include a first vertical field effect transistor (VFET), a second VFET, a third VFET, and a fourth VFET. The second latch may include a fifth VFET, a sixth VFET, a seventh VFET, and an eighth VFET, and the first VFET and the seventh VFET may be arranged along the first horizontal direction. A first portion of the conductive layer may include a gate electrode of the first VFET, and a second portion of the conductive layer may include a gate electrode of the seventh VFET.

According to some embodiments of the present inventive concept, integrated circuit devices may include a substrate including a first region, a second region and a boundary region between the first region and the second region. The first region and the second region may be spaced apart from each other in a first horizontal direction that is parallel to an upper surface of the substrate. The integrated circuit devices may also include a first latch on the first region of the substrate and a second latch on the second region of the substrate. The first latch may include a first vertical field effect transistor (VFET), a second VFET, a third VFET, and a fourth VFET, and the second latch may include a fifth VFET, a sixth VFET, a seventh VFET, and an eighth VFET. The second VFET, the third VFET, the fifth VFET, and the eighth VFET may be arranged along the first horizontal direction, and the second VFET, the third VFET, the fifth VFET, and the eighth VFET may be configured to share a gate signal applied to respective gate electrodes of the second VFET, the third VFET, the fifth VFET, and the eighth VFET.

According to some embodiments of the present inventive concept, integrated circuit devices may include a substrate including a first region, a second region, and a boundary region between the first region and the second region. The first region and the second region may be spaced apart from each other in a first horizontal direction that is parallel to an upper surface of the substrate. The first region of the substrate may include a NMOS region and a PMOS region that is spaced apart from the NMOS region in the first horizontal direction. The integrated circuit devices may also include a first latch on the first region of the substrate. The first latch may include a first vertical field effect transistor (VFET) and a third VFET on the PMOS region and a second VFET and a fourth VFET on the NMOS region, and the first VFET may include a first channel region and a first top source/drain sequentially stacked on the substrate, the second VFET may include a second channel region and a second top source/drain sequentially stacked on the substrate, the third VFET may include a third channel region and a third top source/drain sequentially stacked on the substrate, and the fourth VFET may include a fourth channel region and a fourth top source/drain sequentially stacked on the substrate. The integrated circuit devices may further include a second latch on the second region of the substrate and a top source/drain contact. The second latch may include a fifth VFET, a sixth VFET, a seventh VFET, and an eighth VFET. The top source/drain contact may contact the first top source/drain, the second top source/drain, the third top source/drain, and the fourth top source/drain.

DETAILED DESCRIPTION

Figure 1:
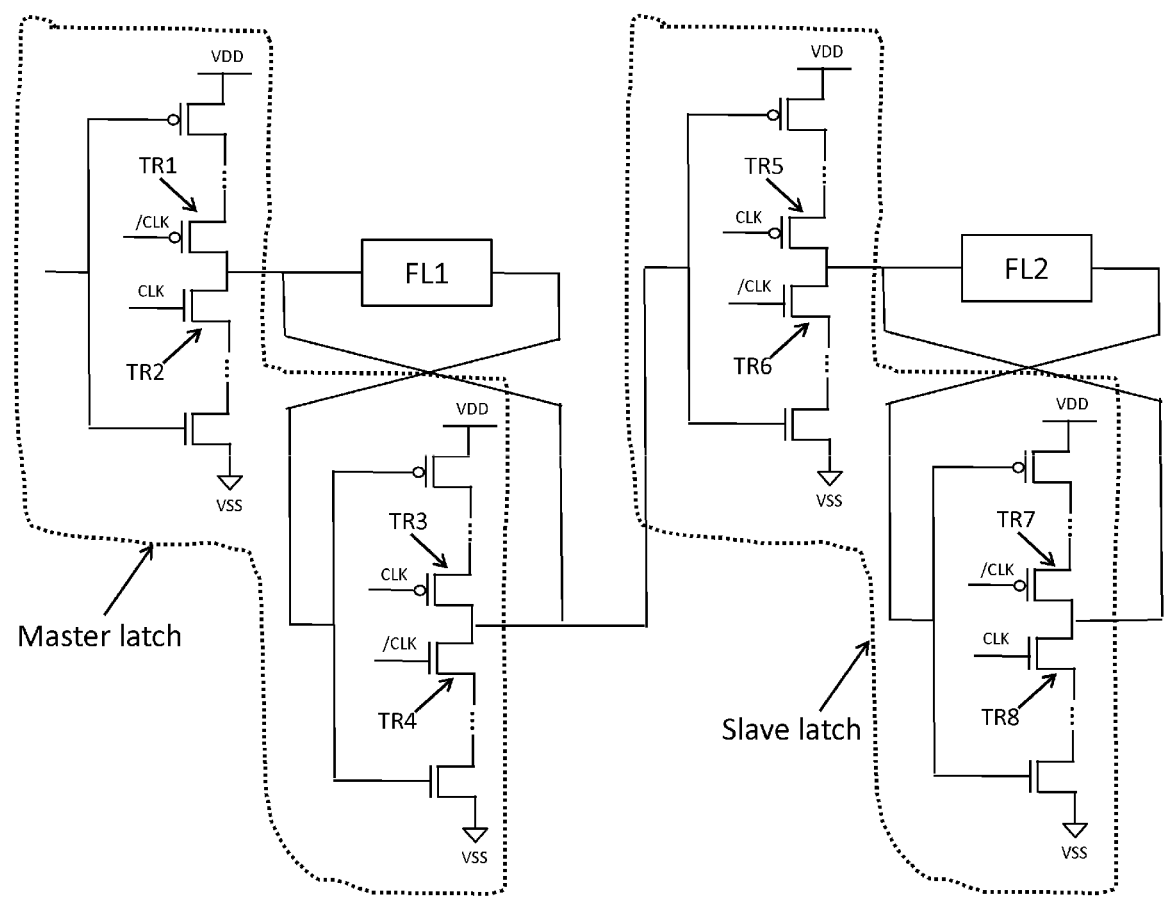
FIG. 1 is a circuit diagram of a device including a master latch and a slave latch.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete and will convey the scope of the disclosure to those skilled in the art. In the drawings, the sizes and relative sizes of layers and regions may be exaggerated for clarity. Like reference numbers refer to like elements throughout.

Example embodiments of the present inventive concept are described herein with reference to cross-sectional views or plan views that are schematic illustrations of idealized embodiments and intermediate structures of example embodiments. As such, variations from the shapes of the illustrations as a result, for example, of manufacturing techniques and/or tolerances, are to be expected. Thus, example embodiments of the present inventive concept should not be construed as limited to the particular shapes illustrated herein but include deviations in shapes that result, for example, from manufacturing.

FIG. 1 is a circuit diagram of a device including a master latch and a slave latch. Each of the master latch and the slave latch has a cross-couple structure. The device illustrated in FIG. 1 may be a portion of a flip-flop circuit. In some embodiments, the device illustrated in FIG. 1 may be a portion of a scan flip-flop circuit but the present inventive concept is not limited thereto. The device illustrated in FIG. 1 may be a portion of different types of a flip-flop circuit.

Referring to FIG. 1, a first transistor TR1, a second transistor TR2, a third transistor TR3, and a fourth transistor TR4 of the master latch form a first cross-couple structure, and a fifth transistor TR5, a sixth transistor TR6, a seventh transistor TR7, and an eighth transistor TR8 of the slave latch form a second cross-couple structure. Types and numbers of transistors between VDD and one of the first transistor TR1, the third transistor TR3, the fifth transistor TR5, and the seventh transistor TR7, and types and numbers of transistors between VSS and one of the second transistor TR2, the fourth transistor TR4, the sixth transistor TR6, and the eighth transistor TR8 may vary depending on the type of a flip-flop circuit including the master latch and the slave latch. Further, a first feed-back loop FL1 and a second feed-back loop FL2 may include various types and numbers of transistors depending on the type of a flip-flop circuit.

In some embodiments, each of the first, third, fifth, and seventh transistors TR1, TR3, TR5, and TR7 may be a p-type transistor, and each of the second, fourth, sixth, and eighth transistors TR2, TR4, TR6, and TR8 may be an n-type transistor, as illustrated in FIG. 1.

According to FIG. 1, a clock signal (CLK) may be applied to multiple transistors (e.g., the second transistor TR2, the third transistor TR3, the fifth transistor TR5, and the eighth transistor TR8), and an inverted clock signal (/CLK) may be applied to multiple transistors (e.g., the first transistor TR1, the fourth transistor TR4, the sixth transistor TR6, and the seventh transistor TR7). It will be understood that, in some embodiments, a clock signal (CLK) may be applied to the first transistor TR1, the fourth transistor TR4, the sixth transistor TR6, the seventh transistor TR7, and an inverted clock signal (/CLK) may be applied to the second transistor TR2, the third transistor TR3, the fifth transistor TR5, and the eighth transistor TR8.

Since each of the clock signal (CLK) and the inverted clock signal (/CLK) is shared by multiple transistors, a single conductive line (e.g., a conductive layer 220 in FIG. 3B) through which one of the clock signal (CLK) and the inverted clock signal (/CLK) is applied may be shared by the multiple transistors. It will be understood that sharing a single conductive line with multiple transistors may reduce a total number of conductive lines included in the device, and thus a shared single conductive line may simplify a layout of the device and may reduce an amount of a conductive material used to form the device.

Figure 2:
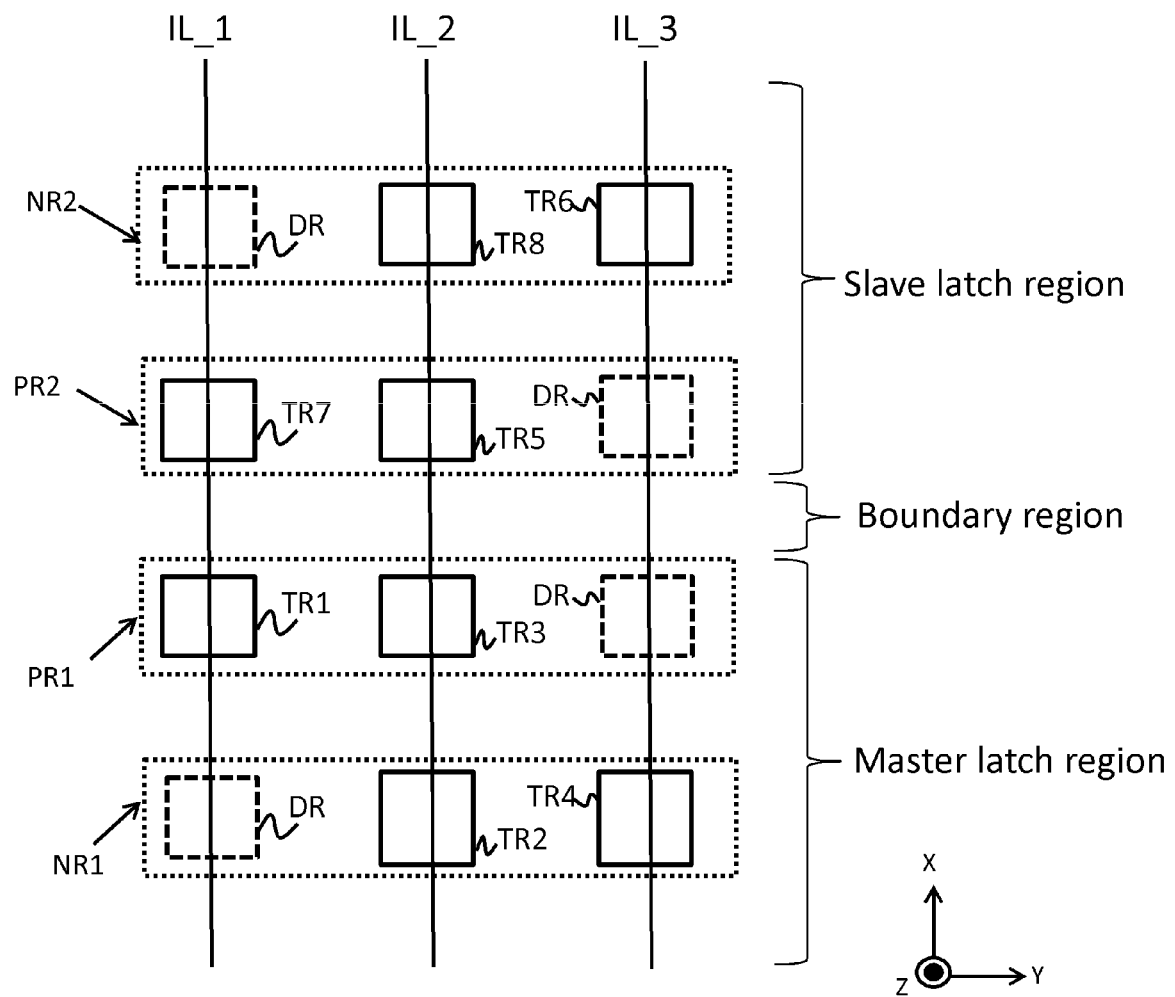
FIG. 2 is the arrangement of transistors included in the master latch and the slave latch illustrated in FIG. 1 according some embodiments of the present inventive concept.

FIG. 2 shows the arrangement of transistors included in the master latch and the slave latch illustrated in FIG. 1 according some embodiments of the present inventive concept. The master latch including the first, second, third, and fourth transistors TR1, TR2, TR3, and TR4 may be provided on a first latch region (i.e., a master latch region) and a slave latch including the fifth, sixth, seventh, and eighth transistors TR5, TR6, TR7, and TR8 may be provided on a second latch region (i.e., a slave latch region). To provide shared conductive lines for multiple transistors, the master latch region and the slave latch region may be arranged along a first horizontal direction (e.g., a X direction in FIG. 2), and the master latch and the slave latch may form a double height structure, as illustrated in FIG. 2. It will be understood that the term "height" in "double height structure" does not mean that the master latch region and the slave latch region are stacked in a vertical direction. The master latch region and the slave latch region may be spaced apart from each other in the first horizontal direction and a boundary region may be provided between the master latch region and the slave latch region.

It will be understood that "an element A and an element B are arranged along a direction X" (or similar language) may mean that the element A and the element B are spaced apart from each other in the direction X and are aligned along the direction X.

The master latch region may include a first NMOS region NR1 and a first PMOS region PR1 between the first NMOS region NR1 and the boundary region. P-type transistors of the master latch (i.e., the first transistor TR1 and the third transistor TR3) may be provided on the first PMOS region PR1, and N-type transistors of the master latch (i.e., the second transistor TR2 and the fourth transistor TR4) may be provided on the first NMOS region NR1. The first transistor TR1 and the third transistor TR3 may be spaced apart from each other in and may be arranged along a second horizontal direction (e.g., a Y direction in FIG. 2) as illustrated in FIG. 2. The second transistor TR2 and the fourth transistor TR4 may be spaced apart from each other in and may be arranged along the second horizontal direction. In some embodiments, the first horizontal direction is perpendicular to the second horizontal direction.

The slave latch region may include a second NMOS region NR2 and a second PMOS region PR2 between the second NMOS region NR2 and the boundary region. P-type transistors of the slave latch (i.e., the fifth transistor TR5 and the seventh transistor TR7) may be provided on the second PMOS region PR2, and N-type transistors of the slave latch (i.e., the sixth transistor TR6 and the eighth transistor TR8) may be provided on the second NMOS region NR2.

Referring to FIG. 2, the first transistor TR1 of the master latch to which the inverted clock signal (/CLK) is applied and the seventh transistor TR7 of the slave latch to which the inverted clock signal (/CLK) is applied may be arranged on a first imaginary line IL_1 and may be spaced apart from each other in the first horizontal direction. The first transistor TR1 and the seventh transistor TR7 may be provided at locations at which the first imaginary line IL_1 intersects the first PMOS region PR1 and the second PMOS region PR2, respectively. Accordingly, a single conductive layer (e.g., a conductive layer 220 in FIG. 3B) that extends in the first horizontal direction and receives the inverted clock signal (/CLK) may be shared by the first transistor TR1 and the seventh transistor TR7. The first transistor TR1 and the seventh transistor TR7 may share a gate signal (e.g., the inverted clock signal (/CLK)).

Still referring to FIG. 2, the second and third transistors TR2 and TR3 of the master latch to which the clock signal (CLK) is applied and the fifth and eighth transistors TR5 and TR8 of the slave latch to which the clock signal (CLK) is applied may be on a second imaginary line IL_2 and may be spaced apart from each other in the first horizontal direction. The second, third, fifth, and eighth transistors TR2, TR3, TR5, TR8 may be provided at locations at which the second imaginary line IL_2 intersects the first NMOS region NR1, the first PMOS region PR1, the second PMOS region PR2, and the second NMOS region NR2, respectively. Accordingly, a single conductive layer (e.g., a conductive layer 220 in FIG. 3B) that extends in the first horizontal direction and receives the clock signal (CLK) may be shared by the second, third, fifth, and eighth transistors TR2, TR3, TR5, and TR8. The second, third, fifth, and eighth transistors TR2, TR3, TR5, and TR8 may share a gate signal (e.g., the clock signal (CLK)).

Therefore, it will be understood that the double height structure may allow transistors included in different latches (i.e., the master latch and the slave latch) to share a conductive layer through which one of the clock signal (CLK) or the inverted clock signal (/CLK) is applied and thus to share a gate signal.

According to FIG. 2, the fourth transistor TR4 of the master latch to which the inverted clock signal (/CLK) is applied and the sixth transistor TR6 of the slave latch to which the inverted clock signal (/CLK) is applied may be arranged on a third imaginary line IL_3 and may be spaced apart from each other in the first horizontal direction. The fourth transistor TR4 and the sixth transistor TR6 may be provided at locations at which the third imaginary line IL_3 intersects the first NMOS region NR1 and the second NMOS region NR2, respectively.

In some embodiments, the device may include dummy regions DRs at which no transistor is provided. The device may include two dummy regions DRs at locations at which the first imaginary line IL_1 intersects the first NMOS region NR1 and the second NMOS region NR2, respectively, as illustrated in FIG. 2. The device may also include two dummy regions DRs at locations at which the third imaginary line IL_3 intersects the first PMOS region PR1 and the second PMOS region PR2, respectively, as illustrated in FIG. 2.

In some embodiments, the first, second and third imaginary lines may extend in the first horizontal direction and may be spaced apart from each other in a second horizontal direction that is parallel to the upper surface of the substrate and is perpendicular to the first horizontal direction, as illustrated in FIG. 2. The second imaginary line may be between the first imaginary line and the third imaginary line. It will be understood that the first, second and third imaginary lines may correspond to first, second, and third columns, respectively.

It will be understood that using vertical field effect transistors (VFETs) may further simplify a layout of a device. A VFET includes a vertical channel that protrudes from a substrate in a vertical direction (e.g., a direction perpendicular to an upper surface or a lower surface of the substrate) and a top source/drain that overlies the vertical channel. As the top source/drain is an uppermost part of the VFET, the top source/drain of the VFET and a top source/drain of an adjacent VFET may be connected through a horizontal conductive pattern on the top source/drains.

FIGS. 3A, 3B, 3C, and 3D illustrate layouts of a device according to some embodiments of the present inventive concept. To simplify the drawings, each of FIGS. 3A through 3D shows a group of some elements, rather than all elements of the device.

Figure 3A:
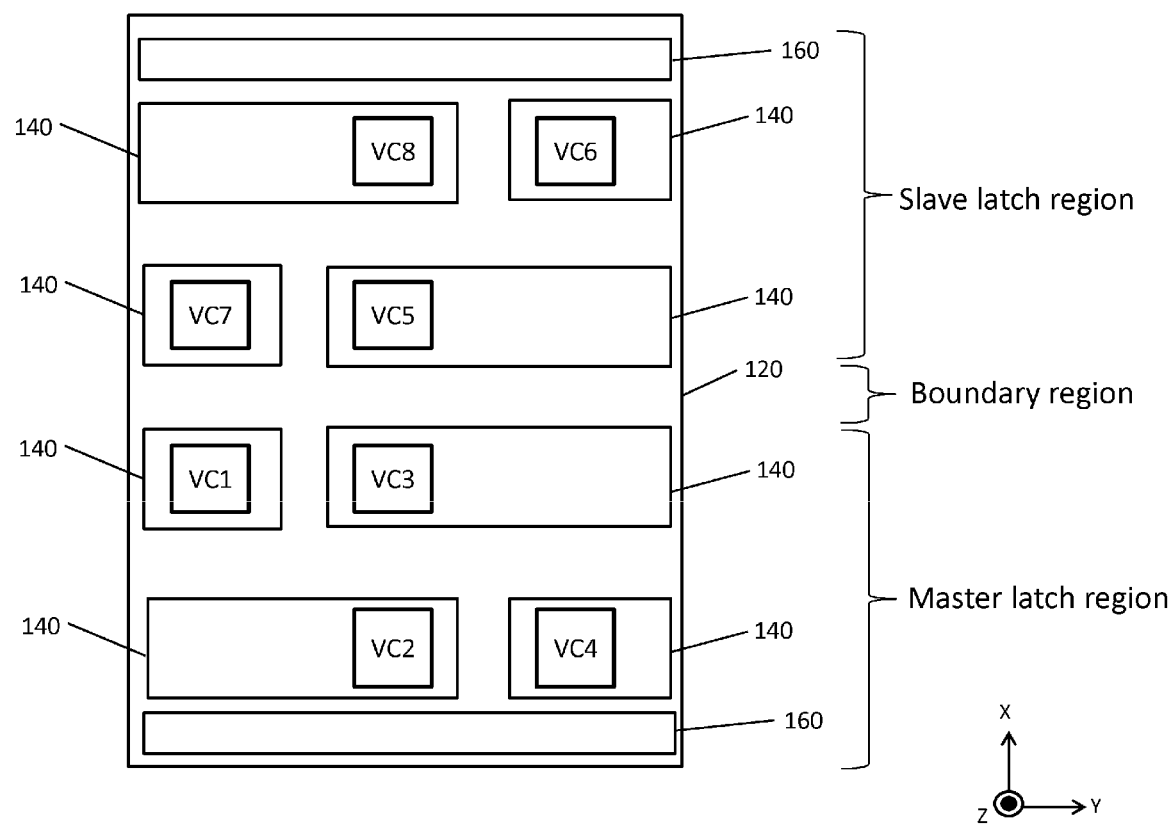
FIGS. 3A, 3B, 3C, and 3D illustrate layouts of a device according to some embodiments of the present inventive concept.

Referring to FIG. 3A, a substrate (e.g., a substrate 100 in FIG. 5A) may include a master latch region, a slave latch region that is spaced apart from the master latch region in a first horizontal direction (e.g., a X direction), and a boundary region between the master latch region and the slave latch region. The first horizontal direction may be parallel to an upper surface or a lower surface of the substrate. Each of transistors of the master latch and the slave latch may be a VFET and may include a vertical channel. The first, second, third, fourth, fifth, sixth, seventh, and eighth transistors TR1 through TR8 may include a first vertical channel VC1, a second vertical channel VC2, a third vertical channel VC3, a fourth vertical channel VC4, a fifth vertical channel VC5, a sixth vertical channel VC6, a seventh vertical channel VC7, and an eighth vertical channel VC8, respectively.

Bottom source/drains 140 may surround each of the transistors, and isolation regions 120 may be provided between the bottom source/drains 140. Bottom source/drain contacts 160 may extend longitudinally in a second horizontal direction (e.g., a Y direction). In some embodiments, the second horizontal direction may be parallel to the upper surface or the lower surface of the substrate and may be perpendicular to the first horizontal direction.

Figure 3B:
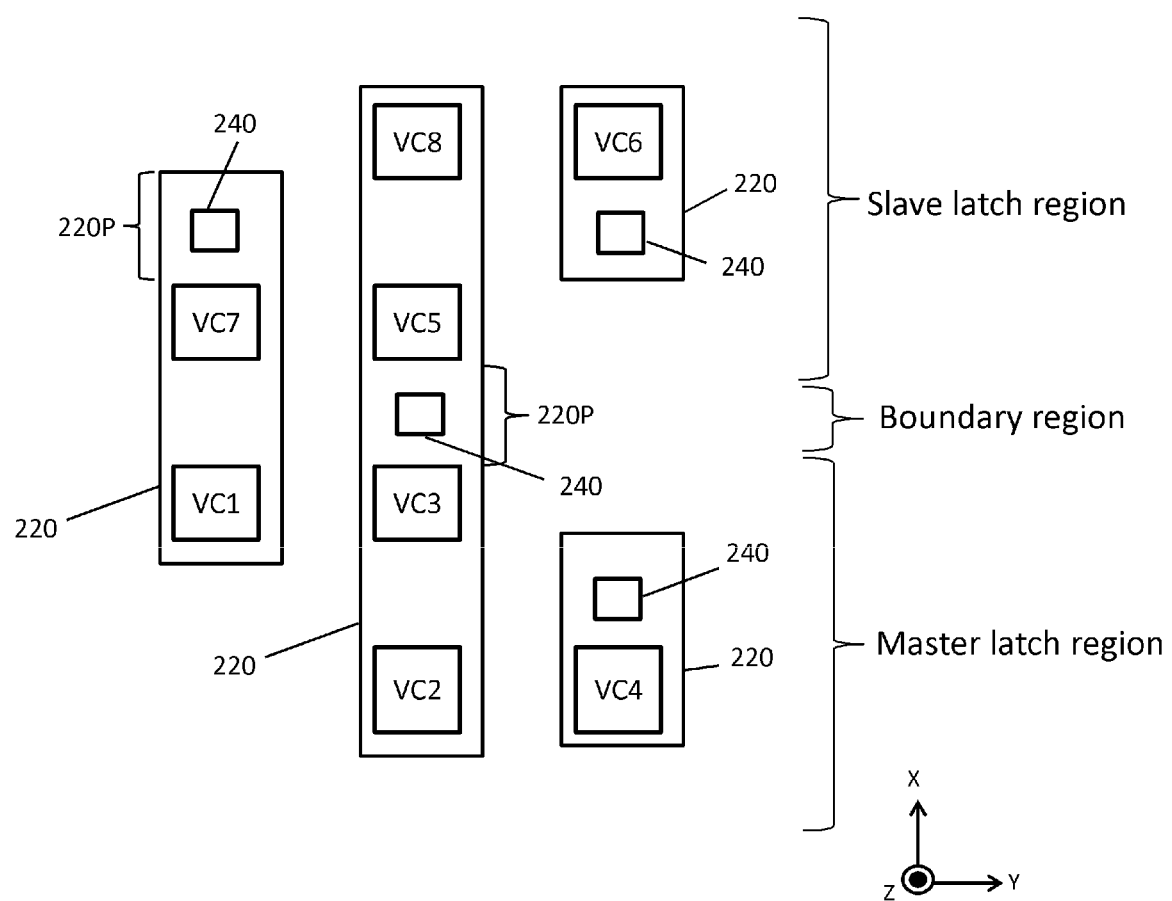

Referring to FIG. 3B, each of conductive layers 220 may extend longitudinally in the first horizontal direction. One of the conductive layers 220 may be shared by the first and seventh vertical channels VC1 and VC7. The conductive layer 220 shared by the first and seventh vertical channels VC1 and VC7 includes a portion that surrounds the first vertical channel VC1 and may constitute a gate electrode of the first transistor TR1 and a portion that surrounds the seventh vertical channel VC7 and may constitute a gate electrode of the seventh transistor TR7.

In some embodiments, one of the conductive layers 220 may be shared by the second, third, fifth, and eighth vertical channels VC2, VC3, VC5, and VC8. The conductive layer 220 shared by the second, third, fifth, and eighth vertical channels VC2, VC3, VC5, and VC8 includes portions that surround the second, third, fifth, and eighth vertical channels VC2, VC3, VC5, and VC8, respectively. Each of the surrounding portions of the conductive layer 220 may constitute a gate electrode of one of the second, third, fifth, and eighth transistors TR2, TR3, TR5, and TR8. Two conductive layers 220 may surround the fourth and the sixth vertical channel VC4 and VC6, respectively, and may constitute gate electrodes of the fourth transistor TR4 and the sixth transistor TR6, respectively.

The conductive layer 220 shared by the first and seventh vertical channels VC1 and VC7 may include a pad region 220P that extends from the portion surrounding the seventh vertical channel VC7 in the first horizontal direction and is on the slave latch region. The conductive layer 220 shared by the second, third, fifth, and eighth vertical channels VC2, VC3, VC5, and VC8 may include a pad region 220P on the boundary region. Gate contacts 240 may overlap and may be connected to the pad regions 220P to electrically connect the conductive layers 220 to conductive wires (e.g., 340 in FIG. 3C), respectively. Gate contacts 240 may overlap and may be connected to the conductive layers 220 surrounding fourth and the sixth vertical channel VC4 and VC6, as illustrated in FIG. 3B.

Figure 3C:
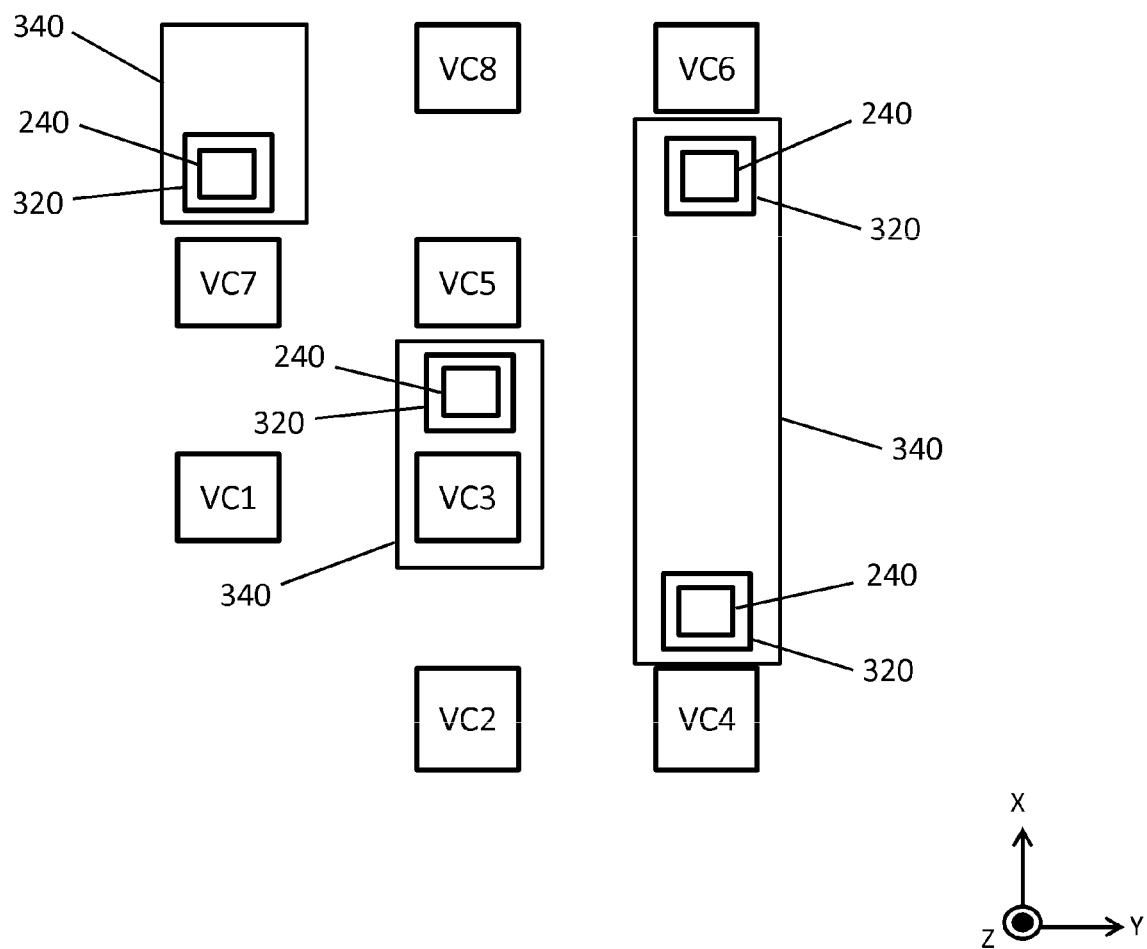

Referring to FIG. 3C, in some embodiments, via contacts 320 may be provided on gate contacts 240, respectively. Each of the via contacts 320 may connect one of the gate contacts 240 to a corresponding conductive wire 340.

Figure 3D:
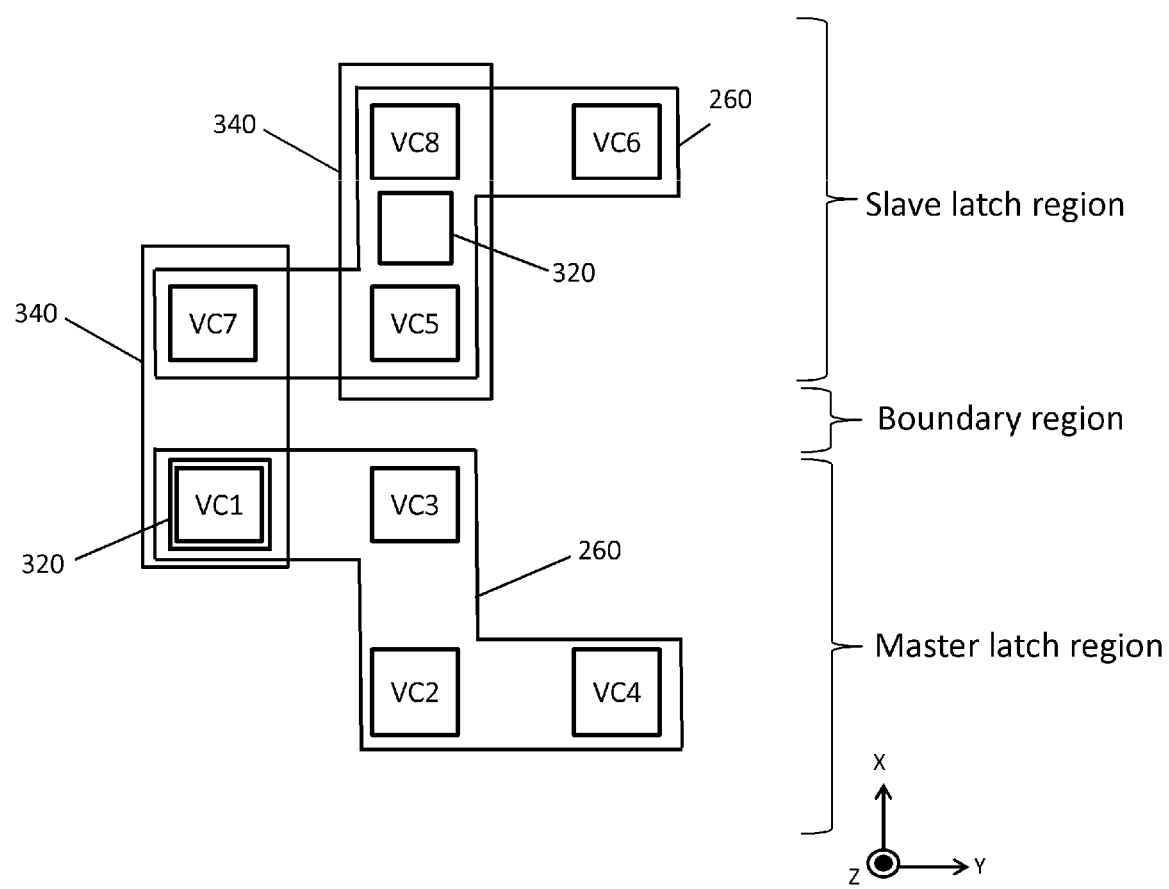

Referring to FIG. 3D, a top source/drain contact 260 overlapping the first, second, third, and fourth vertical channels VC1, VC2, VC3, and VC4 may be provided, and a top source/drain contact 260 overlapping the fifth, sixth, seventh, and eighth vertical channels VC5, VC6, VC7, and VC8 may be provided. On the master latch region, a via contact 320 may be provided on the top source/drain contact 260 to connect the top source/drain contact 260 to a conductive wire 340. On the slave latch region, a single via contact 320 may be provided on the top source/drain contact 260 to connect the top source/drain contact 260 to a conductive wire 340.

Figure 4:
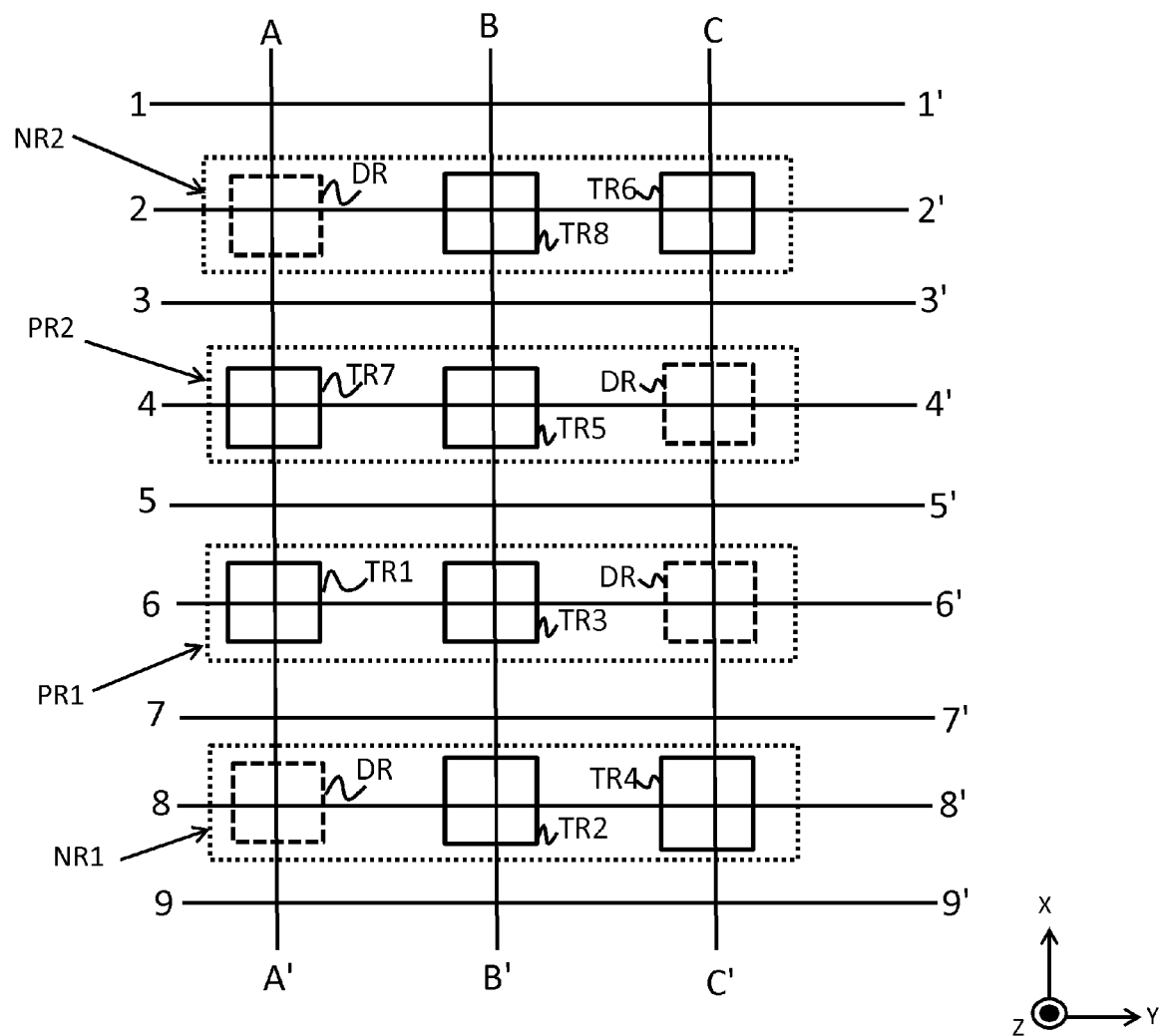
FIG. 4 is a layout with lines along which cross-sectional views are taken.
Figure 5A:
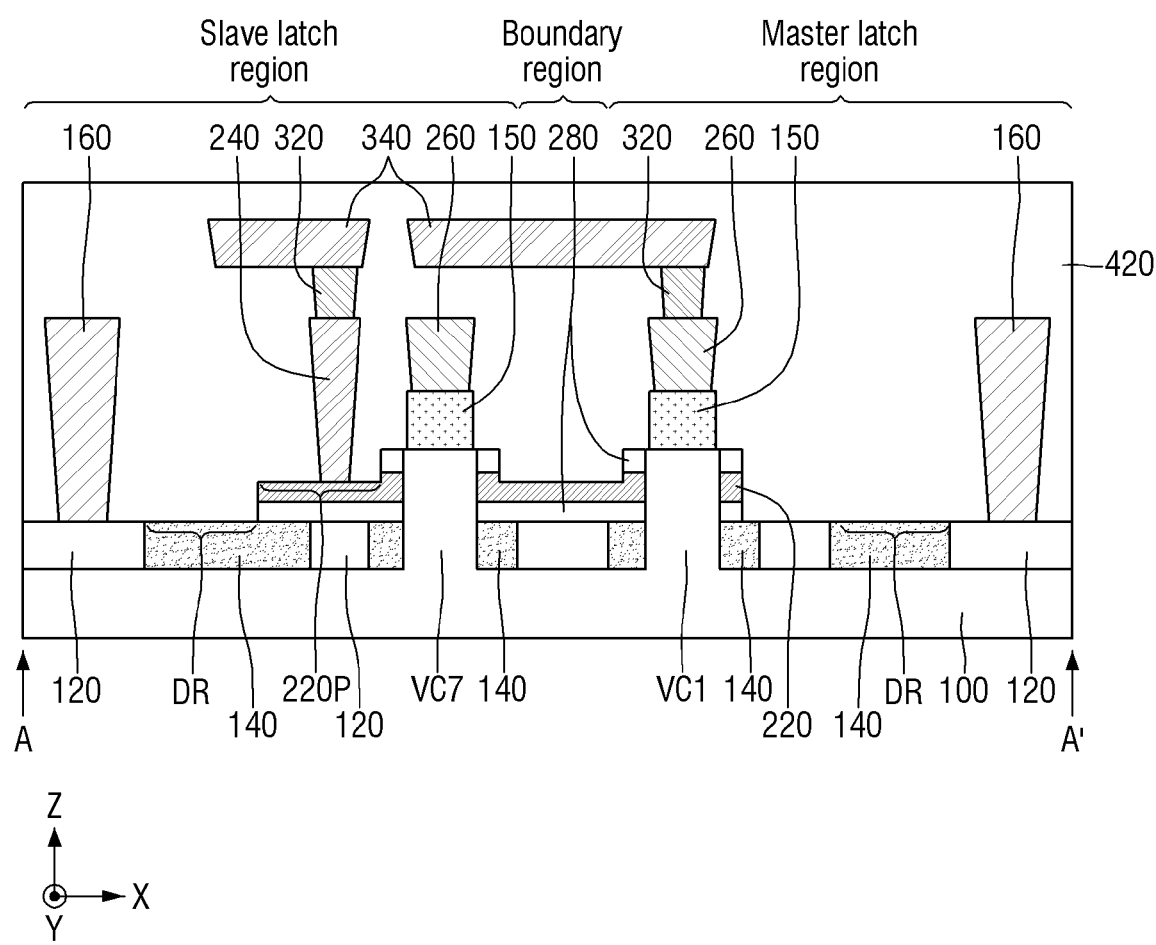
FIGS. 5A, 5B, and 5C are cross-sectional views taken along the lines A-A', B-B', and C-C', respectively, of FIG. 4 according to some embodiments of the present inventive concept.
Figure 5B:
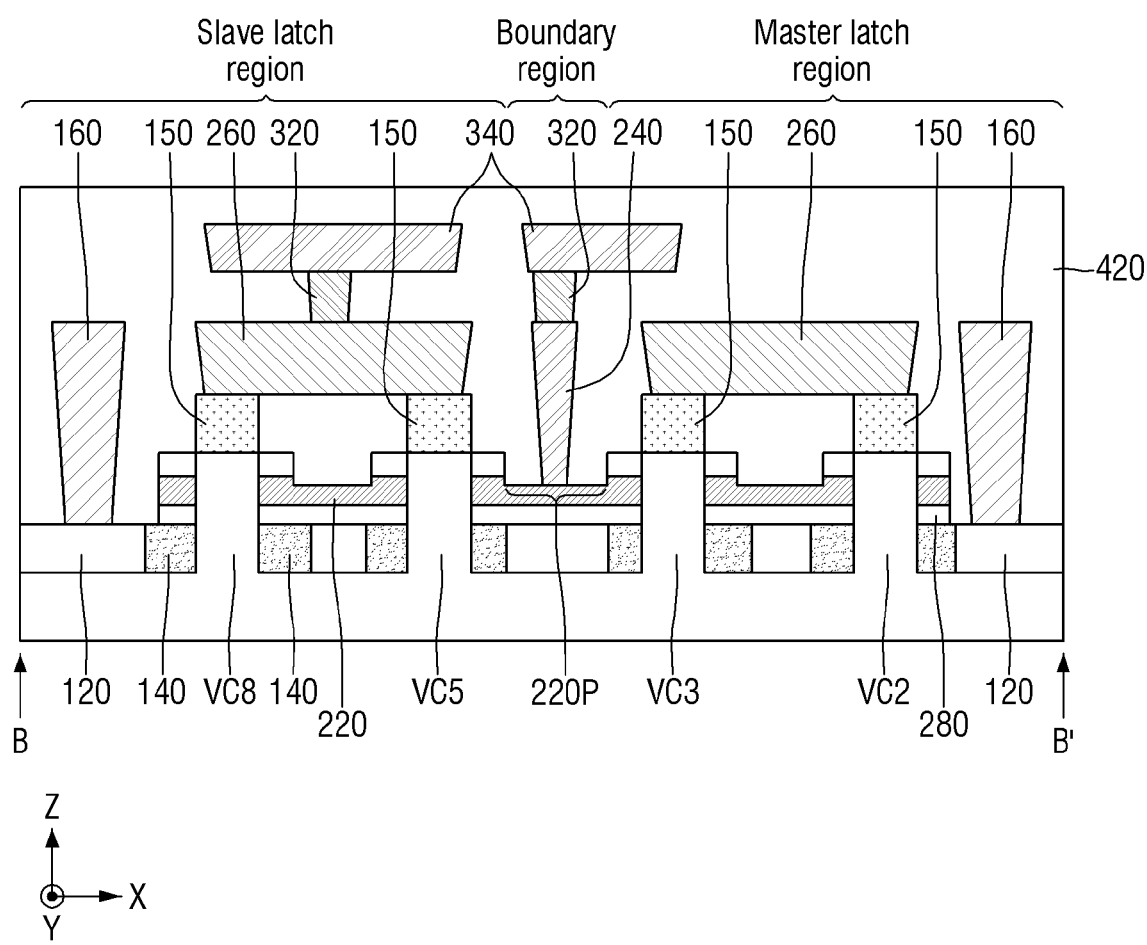
Figure 5C:
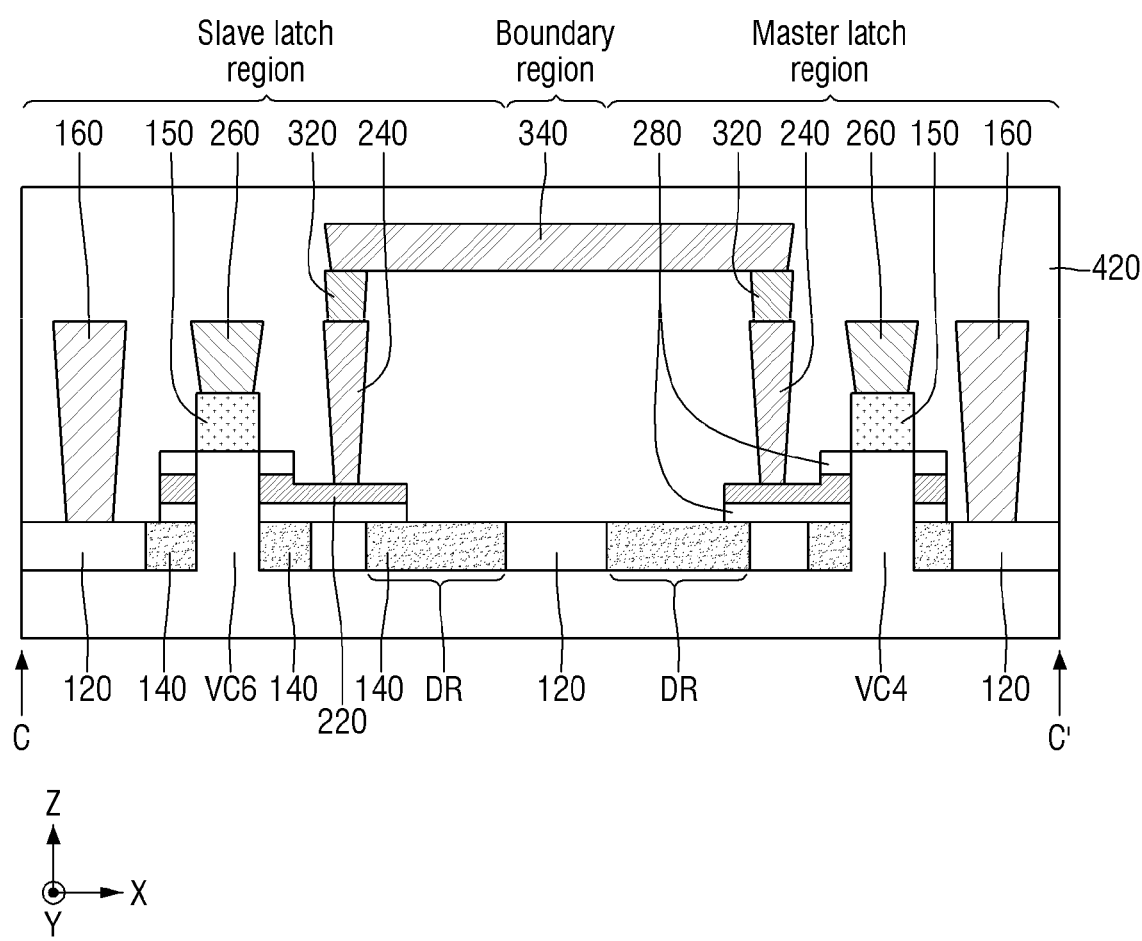

FIG. 4 is a layout with lines along which cross-sectional views are taken. FIGS. 5A, 5B, and 5C are cross-sectional views taken along the lines A-A', B-B', and C-C', respectively, of FIG. 4 according to some embodiments of the present inventive concept. FIGS. 6A, 6B, 6C, 6D, 6E, 6F, 6G, and 6H are cross-sectional views taken along the lines 1-1', 2-2', 3-3', 4-4', 5-5', 6-6', 7-7' and 8-8', respectively, of FIG. 4 according to some embodiments of the present inventive concept.

It will be understood that a cross-sectional view taken along the line 9-9' is the same as or similar to the cross-sectional view taken along the line 1-1'.

Referring to FIG. 5A, a substrate 100 may include a master latch region, a slave latch region and a boundary region between the master latch region and the slave latch region. The master latch region may be spaced apart from the slave latch region in the first horizontal direction. The master latch may be provided on the master latch region of the substrate 100, and the slave latch may be provided on the slave latch region of the substrate 100. The first transistor TR1 includes the first vertical channel VC1 that protrudes from an upper surface of the substrate 100, and a top source/drain 150 on the first vertical channel VC1. A bottom source/drain 140 may be on the substrate 100 and may surround a lower portion of the first vertical channel VC1. In some embodiments, the bottom source/drain 140 may be formed by an epitaxial growth process, and the bottom source/drain 140 may be referred to as a bottom epitaxial layer. The seventh VFET may have a structure similar to the first VFET, as illustrated in FIG. 5A.

Isolation regions 120 may be provided between adjacent bottom source/drains 140 to electrically insulate these bottom source/drains 140 from each other. In some embodiments, the isolation regions 120 may be formed by a shallow trench isolation process, and the isolation regions 120 may be referred to as STI regions.

The conductive layer 220 may surround the vertical channel VC1 and may extend toward the seventh vertical channel VC7. As illustrated in FIG. 5A, the conductive layer 220 may cross over (e.g., extend continuously across) the boundary region of the substrate 100. Spacers 280 may be on a lower surface and/or an upper surface of the conductive layer 220 to electrically insulate the conductive layer 220 from the bottom source/drains 140. The spacer 280 may expose the pad region 220P of the conductive layer 220, as illustrated in FIG. 5A. The spacers 280 may include insulating materials (e.g., silicon oxide).

The top source/drain contacts 260 may contact the top source/drains 150 of the first VFET and the seventh VFET, respectively, as illustrated in FIG. 5A. Referring back to FIG. 3D, the top source/drain contact 260 of the master latch may contact the top source/drains 150 of the first, second, third, and fourth transistors TR1, TR2, TR3, and TR4, and the top source/drain contact 260 of the slave latch may contact the top source/drains 150 of the fifth, sixth, seventh, and eighth transistors TR5, TR6, TR7, and TR8. (See FIGS. 6B and 6C). In some embodiments, the top source/drain contacts 260 of the master latch may be electrically connected to the conductive wire 340 through the via contact 320 that is between the top source/drain contacts 260 and the conductive wire 340, as illustrated in FIG. 5A.

The gate contact 240 may be provided in an insulation layer 420 and may extend in a vertical direction (e.g., a Z direction) that is perpendicular to the upper surface of the substrate 100. Signals (e.g., a clock signal and an inverted clock signal) may be applied to the conductive layer 220 through the gate contact 240. The gate contact 240 may be electrically connected to the conductive wire 340 through the via contact 320 that is between the gate contact 240 and the conductive wire 340, as illustrated in FIG. 5A. The bottom source/drain contact 160 may be provided on the isolation region 120.

Referring to FIGS. 3B and 5B, the conductive layer 220 may extend longitudinally in the first horizontal direction and may cross over the boundary region of the substrate 100. The conductive layer 220 may include portions surrounding the second, third, fifth, and eighth vertical channels VC2, VC3, VC5, and VC8, as illustrated in FIG. 5B, and each surrounding portion of the conductive layer 220 may constitute a gate (e.g., a gate electrode) of one of the second, third, fifth, and eighth transistors TR2, TR3, TR5, and TR8. The conductive layer 220 may include a pad region 220P on the boundary region of the substrate 100 to which the gate contact 240 is connected. The gate contact 240 may extend in the vertical direction and may be electrically connected to the conductive wire 340 through the via contact 320 that is between the gate contact 240 and the conductive wire 340.

Referring to FIG. 5B, top source/drains 150 of the second, third, fifth, and eighth transistors TR2, TR3, TR5, and TR8 are provided on the second, third, fifth, and eighth vertical channels VC2, VC3, VC5, and VC8, respectively. In some embodiments, the top source/drain contact 260 on the master latch region may contact the top source/drains 150 of the second and third transistors TR2 and TR3, and the top source/drain contact 260 on the slave latch region may contact the top source/drains 150 of the fifth and eighth transistors TR5 and TR8. The top source/drain contact 260 on the slave latch region may be electrically connected to the conductive wire 340 through the via contact 320 that is between the top source/drain contact 260 and the conductive wire 340.

Referring to FIG. 5C, the conductive layers 220 may be spaced apart from each other in the first horizontal direction and may surround the fourth vertical channel VC4 and the sixth vertical channel VC6, respectively. The conductive layers 220 may be electrically connected to each other through the gate contacts 240, the via contacts 320 and the conductive wire 340. The spacers 280 may not be provided on portions of the conductive layers 220 to which the gate contacts 240 are connected.

Referring to FIGS. 5A and 5C, the dummy regions DRs are portion of the substrate 100 on which no vertical channel are formed.

Figure 6A:
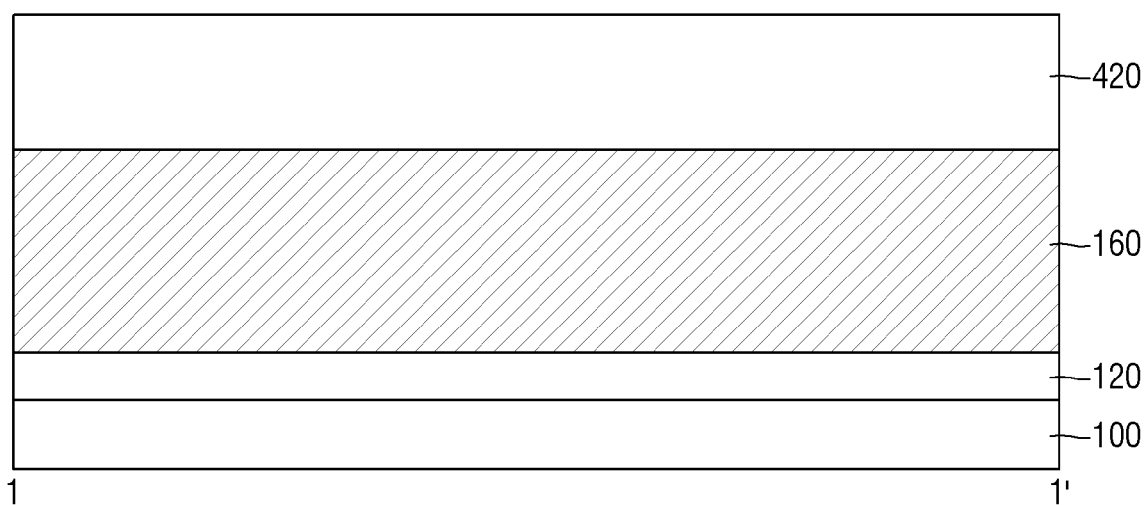
FIGS. 6A, 6B, 6C, 6D, 6E, 6F, 6G, and 6H are cross-sectional views taken along the lines 1-1', 2-2', 3-3', 4-4', 5-5', 6-6', 7-7' and 8-8', respectively, of FIG. 4 according to some embodiments of the present inventive concept.

Referring to FIG. 6A, the bottom source/drain contact 160 may be provided on the isolation region 120 and may extend longitudinally in the second horizontal direction.

Figure 6B:
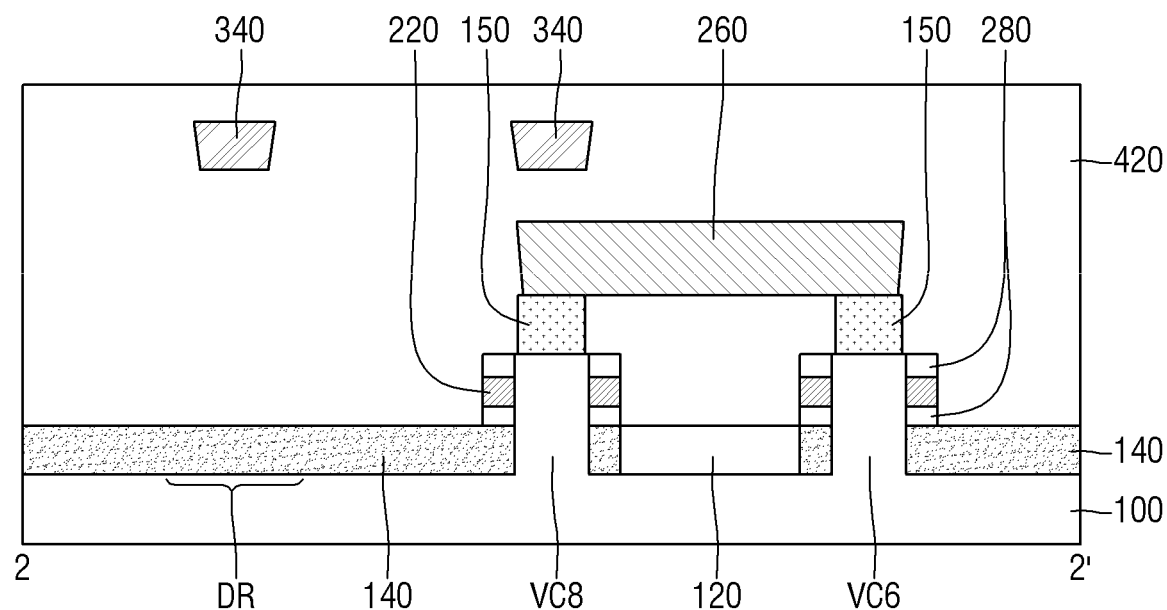

Referring to FIG. 6B, the sixth vertical channel VC6 and the eighth vertical channel VC8 may be spaced apart from each other in the second horizontal direction, and top source/drains 150 may be provided on the sixth and eighth vertical channels VC6 and VC8, respectively. In some embodiments, the top source/drain contact 260 may contact the top source/drains 150 of the sixth and eighth transistors TR6 and TR8.

Figure 6C:
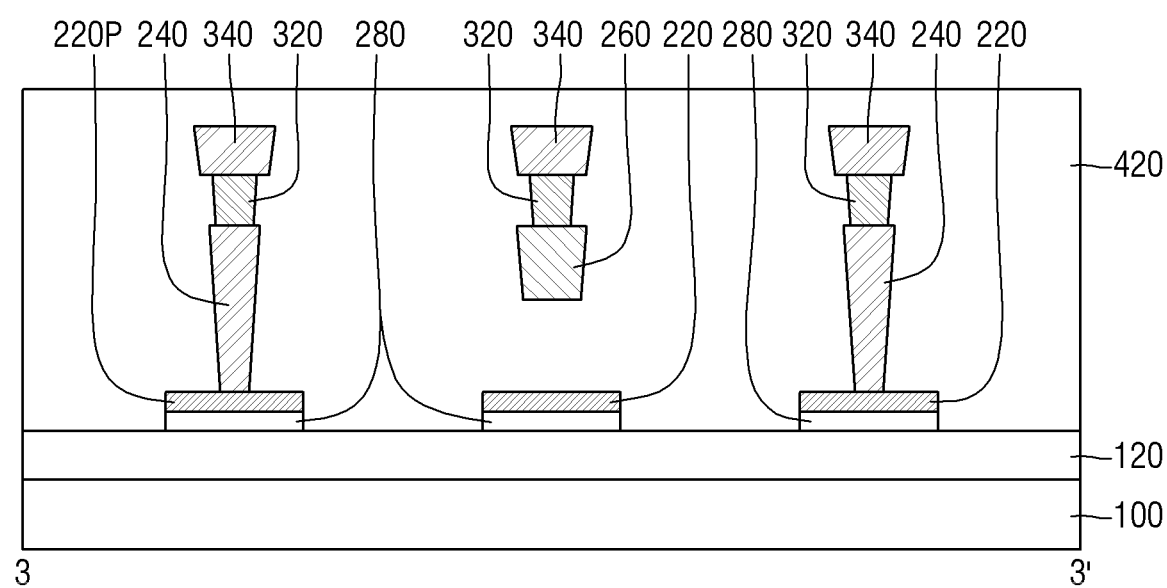
Figure 6C:
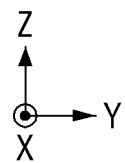

Referring to FIG. 6C, the conductive layers 220 may be provided on the isolation region 120 extending between the NMOS region and the PMOS region of the slave latch region. The pad region 220P of the conductive layer 220 may be electrically connected to the conductive wire 340 through the gate contact 240 and the via contact 320. The top source/drain contact 260 may be electrically connected to the conductive wire 340 through the gate contact 240 and the via contact 320. The conductive layer 220 may be electrically connected to the conductive wire 340 through the gate contact 240 and the via contact 320.

Figure 6D:
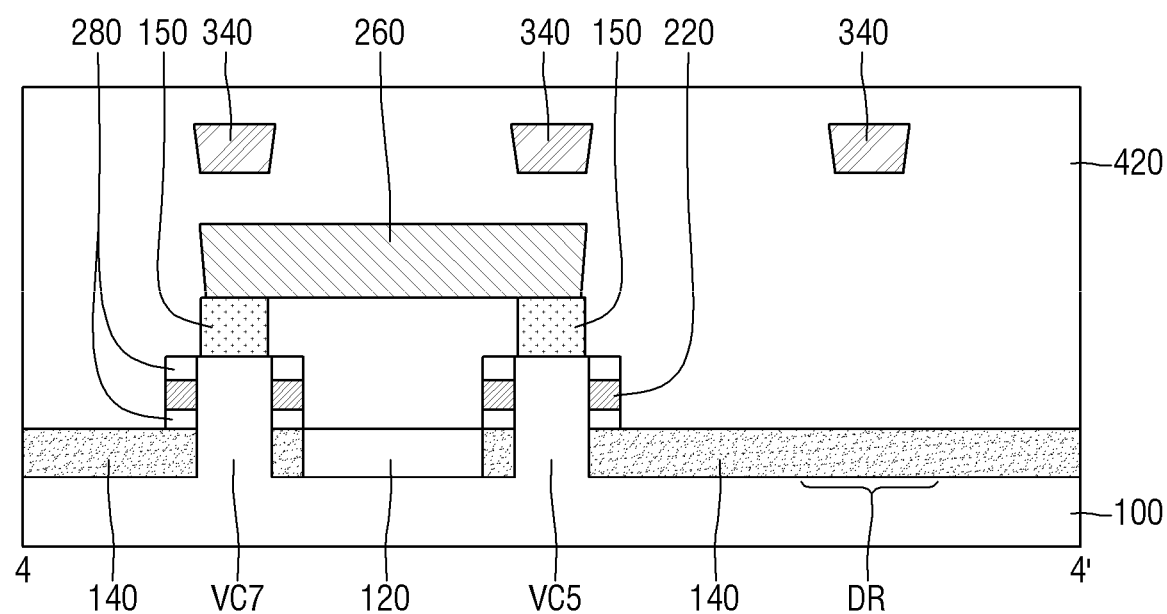
Figure 6D:
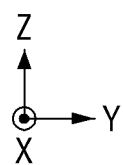

Referring to FIG. 6D, the fifth vertical channel VC5 and the seventh vertical channel VC7 may be spaced apart from each other in the second horizontal direction, and top source/drains 150 may be provided on the fifth and seventh vertical channels VC5 and VC7, respectively. In some embodiments, the top source/drain contact 260 may contact the top source/drains 150 of the fifth and seventh transistors TR5 and TR7.

Figure 6E:
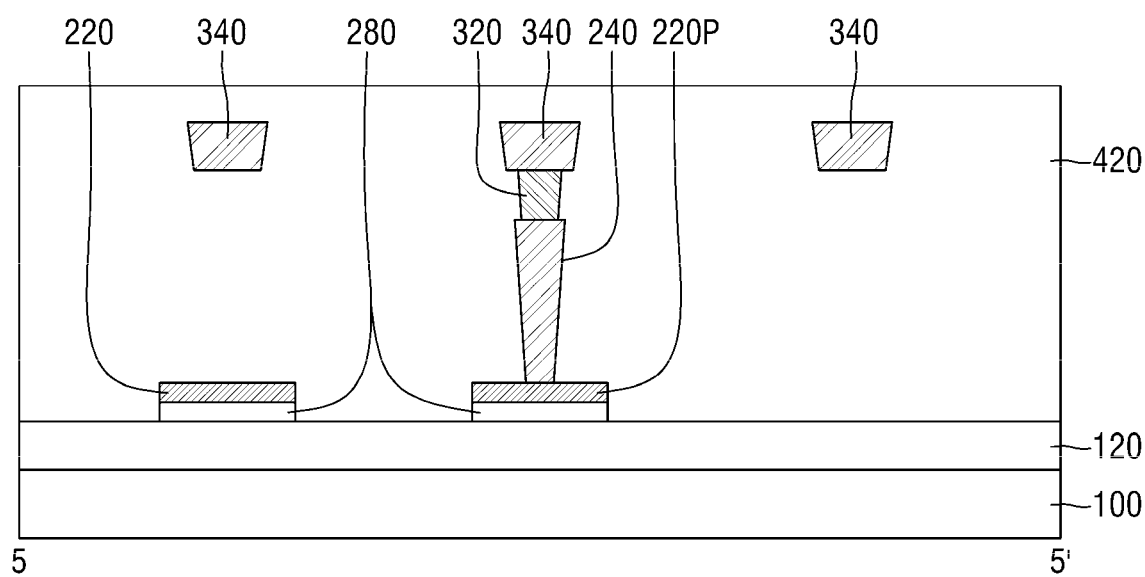

Referring to FIG. 6E, the conductive layers 220 may be provided on the isolation region 120 on the boundary region. The pad region 220P of the conductive layer 220 on the boundary region may be electrically connected to the conductive wire 340 through the gate contact 240 and the via contact 320.

Figure 6F:
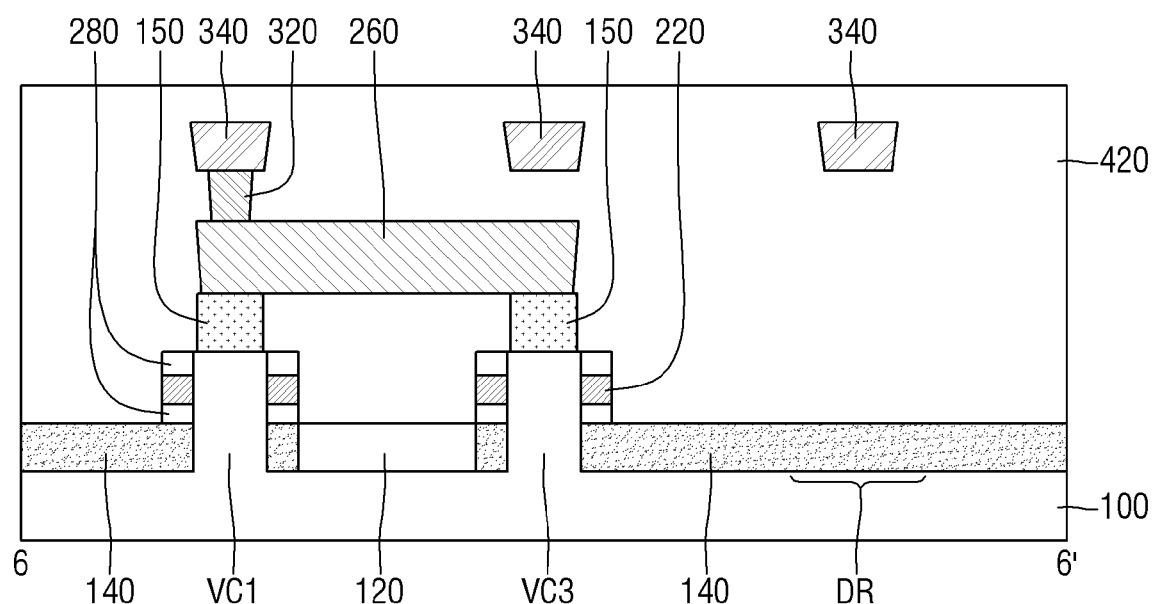
Figure 6F:
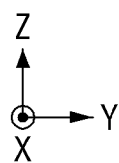

Referring to FIG. 6F, the first vertical channel VC1 and the third vertical channel VC3 may be spaced apart from each other in the second horizontal direction, and top source/drains 150 may be provided on the first and third vertical channels VC1 and VC3, respectively. In some embodiments, the top source/drain contact 260 may contact the top source/drains 150 of the first and third transistors TR1 and TR3. The via contact 320 may be provided on the top source/drain contact 260 to connect the top source/drain contact 260 to a conductive wire 340.

Figure 6G:
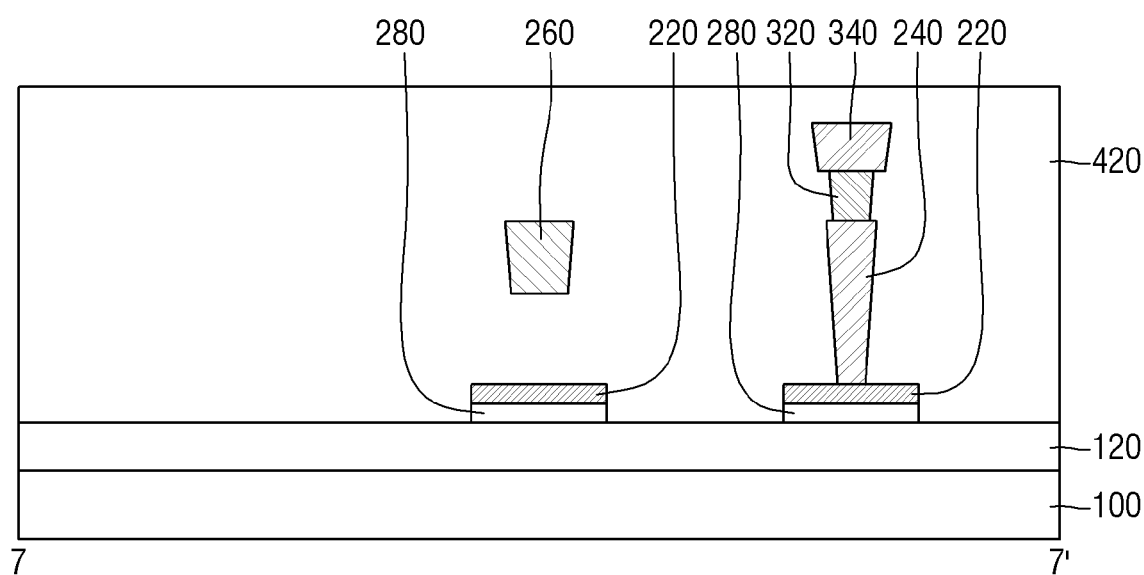

Referring to FIG. 6G, the conductive layers 220 may be provided on the isolation region 120 extending between the first NMOS region NR1 and the first PMOS region PR1 of the master latch region. The conductive layer 220 surrounding and extending from the fourth vertical channel VC4 may be electrically connected to the conductive wire 340 through the gate contact 240 and the via contact 320.

Figure 6H:
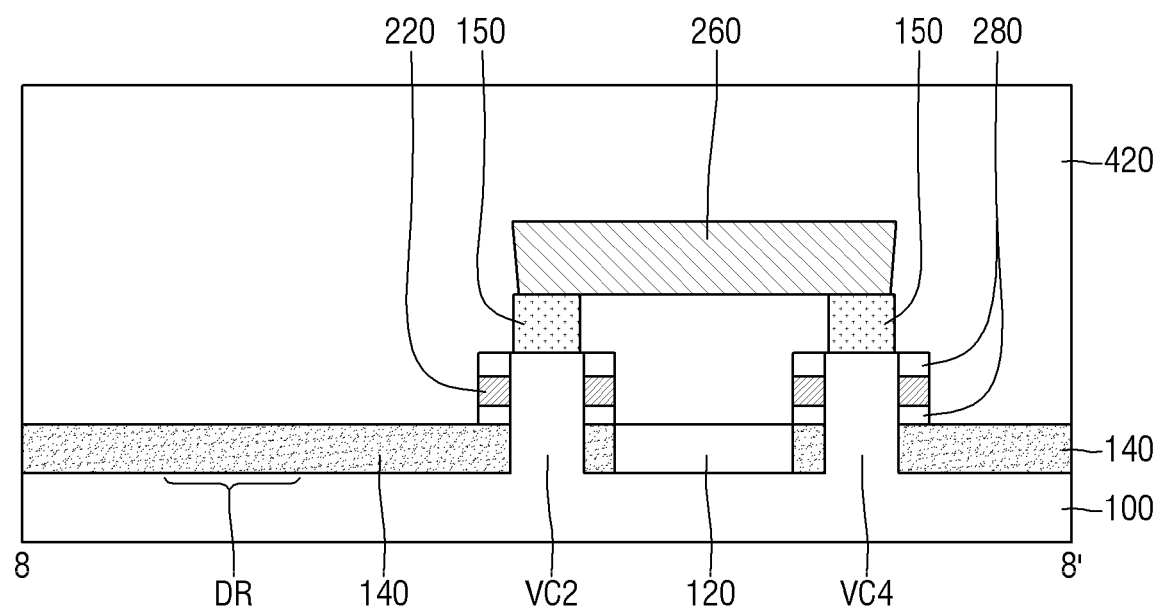

Referring to FIG. 6H, the second vertical channel VC2 and the fourth vertical channel VC4 may be spaced apart from each other in the second horizontal direction, and top source/drains 150 may be provided on the second and fourth vertical channels VC2 and VC4, respectively. In some embodiments, the top source/drain contact 260 may contact the top source/drains 150 of the second and fourth transistors TR2 and TR4.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of the stated features, steps, operations, elements and/or components, but do not preclude the presence or addition of one or more other features, steps, operations, elements, components, and/or groups thereof.

It will be understood that references herein to "an element A vertically overlapping an element B" (or similar language) means that a vertical line intersecting both the elements A and B exists.

It will be understood that although the terms first, second, etc. may be used herein to describe various elements, these elements should not be limited by these terms. These terms are only used to distinguish one element from another. Thus, a first element could be termed a second element without departing from the teachings of the present inventive concept.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. An integrated circuit device comprising:
   a substrate comprising a first region, a second region and a boundary region between the first region and the second region, wherein the first region and the second region are spaced apart from each other in a first horizontal direction that is parallel to an upper surface of the substrate;
   a first latch on the first region of the substrate, wherein the first latch comprises a first vertical field effect transistor (VFET), a second VFET, a third VFET, and a fourth VFET;
   a second latch on the second region of the substrate, wherein the second latch comprises a fifth VFET, a sixth VFET, a seventh VFET, and an eighth VFET, and wherein the first VFET and the seventh VFET are arranged along the first horizontal direction; and
   a conductive layer extending in the first horizontal direction and crossing over the boundary region, wherein a first portion of the conductive layer comprises a gate electrode of the first VFET, and a second portion of the conductive layer comprises a gate electrode of the seventh VFET.

2. The integrated circuit device of claim 1, wherein the conductive layer is configured to receive a clock signal or an inverted clock signal.

3. The integrated circuit device of claim 2, wherein the conductive layer comprises a pad region that protrudes from the second portion of the conductive layer and is on the second region of the substrate, and
   wherein the integrated circuit device further comprises a gate contact extending in a vertical direction that is perpendicular to the upper surface of the substrate and being connected to the pad region of the conductive layer.

4. The integrated circuit device of claim 3, wherein each of the first VFET and the seventh VFET is a p-type VFET, and
   wherein the conductive layer is configured to receive the inverted clock signal.

5. The integrated circuit device of claim 2, wherein the conductive layer comprises a pad region on the boundary region, and wherein the integrated circuit device further comprises a gate contact extending in a vertical direction that is perpendicular to the upper surface of the substrate and being connected to the pad region of the conductive layer.

6. The integrated circuit device of claim 1, wherein the first VFET comprises a first channel region and a first top source/drain sequentially stacked on the substrate, the second VFET comprises a second channel region and a second top source/drain sequentially stacked on the substrate, the third VFET comprises a third channel region and a third top source/drain sequentially stacked on the substrate, and the fourth VFET comprises a fourth channel region and a fourth top source/drain sequentially stacked on the substrate, and
wherein the integrated circuit device further comprises a top source/drain contact that contacts the first top source/drain, the second top source/drain, the third top source/drain, and the fourth top source/drain.

7. The integrated circuit device of claim 6, wherein the first region of the substrate comprises a NMOS region and a PMOS region that is between the NMOS region and the boundary region,
wherein each of the first VFET and the third VFET is a P-type VFET, and the first VFET and the third VFET are on the PMOS region and are arranged along a second horizontal direction that is parallel to the upper surface of the substrate and is perpendicular to the first horizontal direction, and
wherein each of the second VFET and the fourth VFET is an N-type VFET, and the second VFET and the fourth VFET are on the NMOS region and are arranged along the second horizontal direction.

8. The integrated circuit device of claim 7, wherein the second VFET and the third VFET are arranged along the first horizontal direction.

9. An integrated circuit device comprising:
a substrate comprising a first region, a second region and a boundary region between the first region and the second region, wherein the first region and the second region are spaced apart from each other in a first horizontal direction that is parallel to an upper surface of the substrate;
a first latch on the first region of the substrate, wherein the first latch comprises a first vertical field effect transistor (VFET), a second VFET, a third VFET, and a fourth VFET; and
a second latch on the second region of the substrate, wherein the second latch comprises a fifth VFET, a sixth VFET, a seventh VFET, and an eighth VFET,
wherein the second VFET, the third VFET, the fifth VFET, and the eighth VFET are arranged along the first horizontal direction, and
wherein the second VFET, the third VFET, the fifth VFET, and the eighth VFET are configured to share a gate signal applied to respective gate electrodes of the second VFET, the third VFET, the fifth VFET, and the eighth VFET.

10. The integrated circuit device of claim 9, wherein the gate signal is a clock signal or an inverted clock signal.

11. The integrated circuit device of claim 9, further comprising a conductive layer extending in the first horizontal direction and crossing over the boundary region,
wherein a first portion of the conductive layer comprises the gate electrode of the second VFET, a second portion of the conductive layer comprises the gate electrode of the third VFET, a third portion of the conductive layer comprises the gate electrode of the fifth VFET, and a fourth portion of the conductive layer comprises the gate electrode of the eighth VFET.

12. The integrated circuit device of claim 11, wherein the conductive layer comprises a pad region on the boundary region, and
wherein the integrated circuit device further comprises a gate contact extending in a vertical direction that is perpendicular to the upper surface of the substrate and being connected to the pad region of the conductive layer.

13. The integrated circuit device of claim 11, wherein the first VFET comprises a first channel region and a first top source/drain sequentially stacked on the substrate, the second VFET comprises a second channel region and a second top source/drain sequentially stacked on the substrate, the third VFET comprises a third channel region and a third top source/drain sequentially stacked on the substrate, and the fourth VFET comprises a fourth channel region and a fourth top source/drain sequentially stacked on the substrate, and
wherein the integrated circuit device further comprises a top source/drain contact that contacts the first top source/drain, the second top source/drain, the third top source/drain, and the fourth top source/drain.

14. The integrated circuit device of claim 13, wherein the first top source/drain is between the substrate and the top source/drain contact.

15. The integrated circuit device of claim 13, wherein the first region of the substrate comprises a NMOS region and a PMOS region that is between the NMOS region and the boundary region,
wherein the first VFET and the third VFET are on the PMOS region and are arranged along a second horizontal direction that is parallel to the upper surface of the substrate and is perpendicular to the first horizontal direction, and
wherein the second VFET and the fourth VFET are on the NMOS region and are arranged along the second horizontal direction.

16. An integrated circuit device comprising:
a substrate comprising a first region, a second region, and a boundary region between the first region and the second region, wherein the first region and the second region are spaced apart from each other in a first horizontal direction that is parallel to an upper surface of the substrate, and wherein the first region of the substrate comprises a NMOS region and a PMOS region that is spaced apart from the NMOS region in the first horizontal direction;
a first latch on the first region of the substrate, wherein the first latch comprises a first vertical field effect transistor (VFET) and a third VFET on the PMOS region and a second VFET and a fourth VFET on the NMOS region, and wherein the first VFET comprises a first channel region and a first top source/drain sequentially stacked on the substrate, the second VFET comprises a second channel region and a second top source/drain sequentially stacked on the substrate, the third VFET comprises a third channel region and a third top source/drain sequentially stacked on the substrate, and the fourth VFET comprises a fourth channel region and a fourth top source/drain sequentially stacked on the substrate;
a second latch on the second region of the substrate, wherein the second latch comprises a fifth VFET, a sixth VFET, a seventh VFET, and an eighth VFET; and a top source/drain contact that contacts the first top source/drain, the second top source/drain, the third top source/drain, and the fourth top source/drain.

17. The integrated circuit device of claim 16, wherein the first VFET is at a first location at which a first imaginary line intersects the PMOS region, the second VFET is at a second location at which a second imaginary line intersects the NMOS region, the third VFET is at a third location at which the second imaginary line intersects the PMOS region, and the fourth VFET is at a fourth location at which a third imaginary line intersects the NMOS region,
 wherein the first, second and third imaginary lines extend in the first horizontal direction and are spaced apart from each other in a second horizontal direction that is parallel to the upper surface of the substrate and is perpendicular to the first horizontal direction, and
 wherein the second imaginary line is between the first imaginary line and the third imaginary line.

18. The integrated circuit device of claim 17, further comprising a conductive layer extending in the first horizontal direction, wherein a first portion of the conductive layer comprises a gate electrode of the second VFET, and a second portion of the conductive layer comprises a gate electrode of the third VFET.

19. The integrated circuit device of claim 18, wherein the conductive layer is configured to receive a clock signal or an inverted clock signal.

20. The integrated circuit device of claim 16, wherein the second VFET, the third VFET, the fifth VFET, and the eighth VFET are arranged along the first horizontal direction,
 wherein the integrated circuit device further comprises a conductive layer extending in the first horizontal direction, and
 wherein a first portion of the conductive layer comprises a gate electrode of the second VFET, a second portion of the conductive layer comprises a gate electrode of the third VFET, a third portion of the conductive layer comprises a gate electrode of the fifth VFET, and a fourth portion of the conductive layer comprises a gate electrode of the eighth VFET.

* * * * *